United States Patent
Dong

[19]

[11] Patent Number: 6,104,850
[45] Date of Patent: Aug. 15, 2000

[54] SEMICONDUCTOR POLARIZATION MODE CONVERTER HAVING A DIFFRACTION GRATING

[75] Inventor: Huang Yi Dong, Tokyo, Japan

[73] Assignee: NEC Corporation, Tokyo, Japan

[21] Appl. No.: 09/110,679

[22] Filed: Jul. 7, 1998

[30] Foreign Application Priority Data

Aug. 7, 1997 [JP] Japan ..................................... 9-182512

[51] Int. Cl.$^7$ .............................. G02B 6/34; G02F 1/365; H01S 3/063
[52] U.S. Cl. .................................... 385/29; 385/2; 385/8; 385/9; 385/131; 372/102
[58] Field of Search ................................. 385/29, 8, 9, 2, 385/131, 37; 372/102, 46, 27

[56] References Cited

U.S. PATENT DOCUMENTS 5,946,336  8/1999  Mizutani et al. ........................ 372/50

FOREIGN PATENT DOCUMENTS

| 4-198913 | 7/1992 | Japan . |
| 5-152687 | 6/1993 | Japan . |
| 5-243551 | 9/1993 | Japan . |
| 7-99369 | 4/1995 | Japan . |
| 8-274412 | 10/1996 | Japan . |
| 9-36496 | 2/1997 | Japan . |

OTHER PUBLICATIONS

Herwig Kogelnik, "Couple Wave Theorgy for Thick Hologram Gratings", The Bell System Technical Journal, vol. 48, No. 9, Nov. 1969, pp. 2909–2947, Nov. 1969.

*Primary Examiner*—Jon Henry
*Attorney, Agent, or Firm*—Sughrue, Mion, Zinn, Macpeak & Seas, PLLC

[57] ABSTRACT

A semiconductor TE/TM mode converter comprises a semiconductor waveguide layer including a compressive-strained first region and a tensile-strained second region, and a diffraction grating formed on the first region. The first region and second region are reversed-biased and forward-biased, respectively. TE mode light incident on the facet of the first region generates TM mode light outgoing from the facet of the second region. The diffraction grating in the first region has selective reflectance against TM mode light and reflects the TM mode light toward the second region, to lower the lasing threshold of TM mode light and raise the conversion efficiency.

6 Claims, 5 Drawing Sheets

SEMICONDUCTOR POLARIZATION MODE CONVERTER HAVING A DIFFRACTION GRATING

BACKGROUND OF THE INVENTION (a) Field of the Invention

The present invention relates to polarization mode converter having a diffraction grating, for use in polarization mode conversion between TE mode light and TM mode light.

(b) Description of the Related Art

An optical waveguide-type polarization mode converter is known which is capable of being integrated with semiconductor lasers to form an optical semiconductor device. FIG. 1A is a schematic sectional view of an example of conventional TE/TM mode converters of this type. The TE/TM mode converter has a structure similar to that of a semiconductor laser of a combined resonator structure and is called as such.

The TE/TM converter has a multiple quantum well (MQW) resonator structure wherein the resonator is divided in the longitudinal direction thereof into two regions 51 and 52. The first region 51 has a compressive-strained MQW structure wherein the compressive strain is introduced in the quantum well active layer, whereas the second region 52 has a tensile-strained MQW structure wherein tensile strain is introduced in the quantum well active layer, both region 51 and region 52 having separate electrodes.

When a compressive strain or tensile strain is introduced into a quantum well active layer, the band structure of the quantum well is generally changed. The first valence band level of compressive-strained MQW resides in a HH band, which causes amplification or absorption for TE mode light. On the other hand, the first valence band level of tensile-strained MQW resides in a LH band, which causes amplification or absorption for TM mode light. Amplification or absorption can be controlled by the bias voltage applied across electrodes of each region depending on the forward bias or the reverse bias of the diode structure of the MQW.

For instance, it is assumed that the first region 51 having a compressive-strained MQW is reverse-biased, the second region 52 having a tensile-strained MQW is forward-biased, and the first region 51 receives incident TE mode light, as shown in FIG. 1A. FIG. 1B shows a dependency of the net gain and TM mode light power generated in the mode converter of FIG. 1A on TE mode light power. With the increase of the incident TE mode light power, as shown in FIG. 1B, the saturable absorption region, i.e., the compressive-strained MQW region 51 more absorbs the TE mode light to decrease the loss of the combined resonator and to increase the net gain. When the net gain exceeds the threshold gain, the amplifying region, i.e., the tensile-strained MQW region 52 lases to generate outgoing TM mode beam. That is, the mode converter of FIG. 1A has a function for converting the incident TE mode light to the outgoing TM mode light.

On the other hand, when the second region 52 having a tensile-strained MQW is reverse-biased whereas the first region 51 having a compressive-strained MQW is forward-biased, the mode converter has a function for converting incident TM mode light to outgoing TE mode light.

In the structure of the conventional TE/TM converter shown in FIG. 1A, it is generally necessary to provide a low reflective coating layer on the incident facet of the combined resonator for obtaining sufficient conversion efficiency. The low reflective coating layer, however, enlarges resonator loss with respect to the lasing TM mode light, and degrades the characteristics of the combined resonator if the outgoing TM mode light returns to the combined resonator at the outgoing facet thereof.

SUMMARY OF THE INVENTION

It is therefore an object of the present invention to provide a semiconductor polarization mode converter having higher conversion efficiency and capable of preventing reflected return light from affecting the characteristics of the mode converter.

The present invention provides a polarization mode converter comprising a semiconductor optical waveguide layer including a first region and a second region, and a diffraction grating on the first region and/or the second region, the first region having a compressive-strained multiple quantum well (MQW) structure, the second region having a tensile-strained MQW structure.

In accordance with the polarization mode converter of the present invention, the diffraction grating selectively reflect one of TE mode light or TM mode light to improve the conversion efficiency between TE mode light and TM mode light. In addition, return light can be also selectively degradation of the characteristics of the mode converter.

The above and other objects, features and advantages of the present invention will be more apparent from the following description, referring to the accompanying drawings.

PREFERRED EMBODIMENTS OF THE INVENTION

Figure 1A:
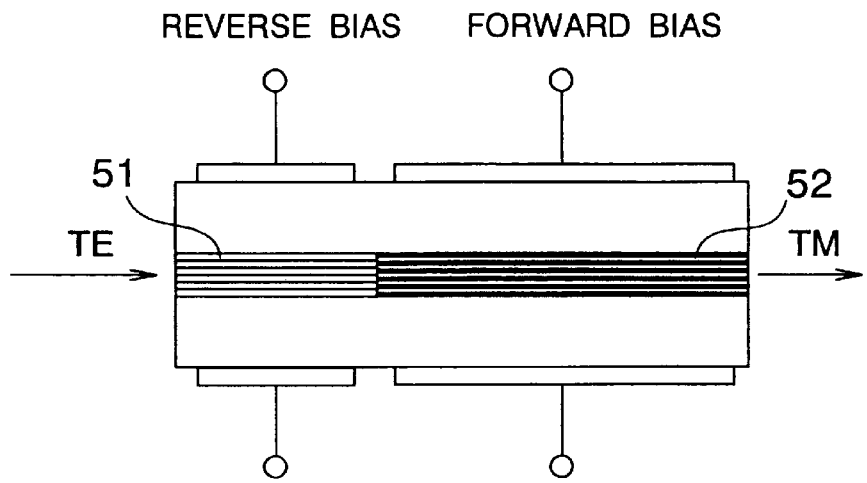
FIG. 1A is a schematic sectional view of an example of conventional TE/TM mode converters.
Figure 1B:
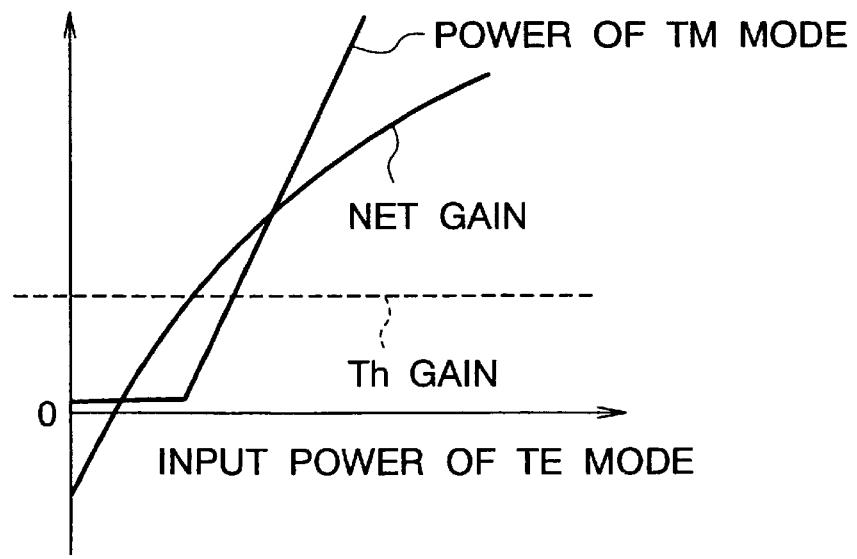
FIG. 1B is a graph showing incident TE mode light power dependency of the net gain in the resonator and the outgoing TM mode light power.

Now, the present invention is more specifically described with reference to accompanying drawings, wherein similar constituent elements are designated by similar reference numerals.

Figure 2A:
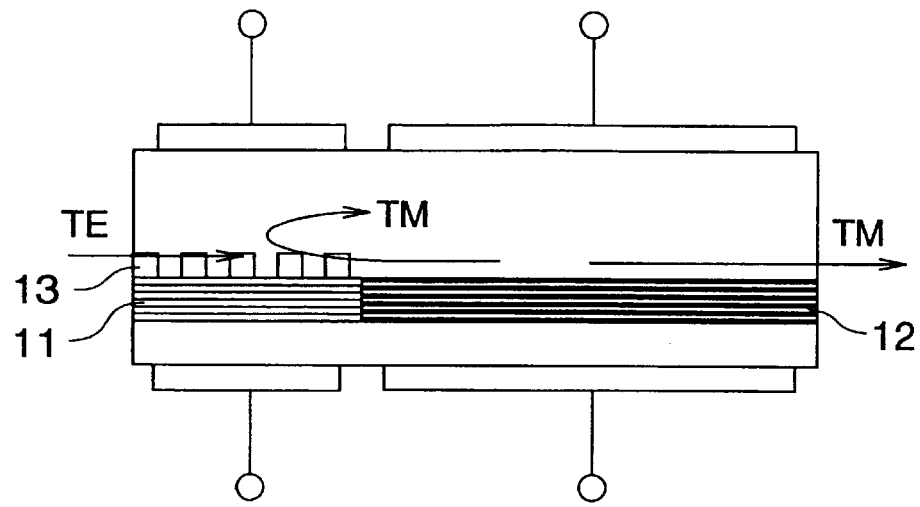
FIG. 2A is a schematic sectional view of an exemplified semiconductor TE/TM mode converter according to the present invention.

Referring to FIG. 2A, an exemplified semiconductor TE/TM mode converter according to the present invention comprises a semiconductor optical waveguide layer which is divided in the longitudinal direction thereof into two adjacent regions; a first region 11 and a second region 12 forming a combined resonator structure. The first region 11 has a compressive-strained MQW structure, whereas the second region 12 has a tensile-strained MQW structure. The first region 11 constitutes a saturable absorption region for TE mode light and the second region 12 constitutes an amplifying region for TM mode light in the combined resonator structure.

A diffraction grating 13 having a desired pitch is formed on the first region 11. The pitch of the diffraction grating 13 is such that the diffraction grating 13 has a higher reflectance against the TM mode light and a lower reflectance against the TE mode light, for example. As a result, when the TE mode light is incident to the first region 11 of the combined resonator structure, the incident TE mode light is little reflected by the diffraction grating 13 and advances in the combined resonator structure. The incident TE mode light is absorbed in the first region 11 having the compressive-strained MQW structure to generate TM mode light, which is incident to the second region 12. The second region amplifies the TM mode light by lasing. The diffraction grating 13 having a higher reflectance against the TM mode light confines the TM mode light in the second region by preventing the TM mode light from returning to the first region 11 from the second region 12, thereby lowering the lasing threshold of TM mode light.

Figure 2B:
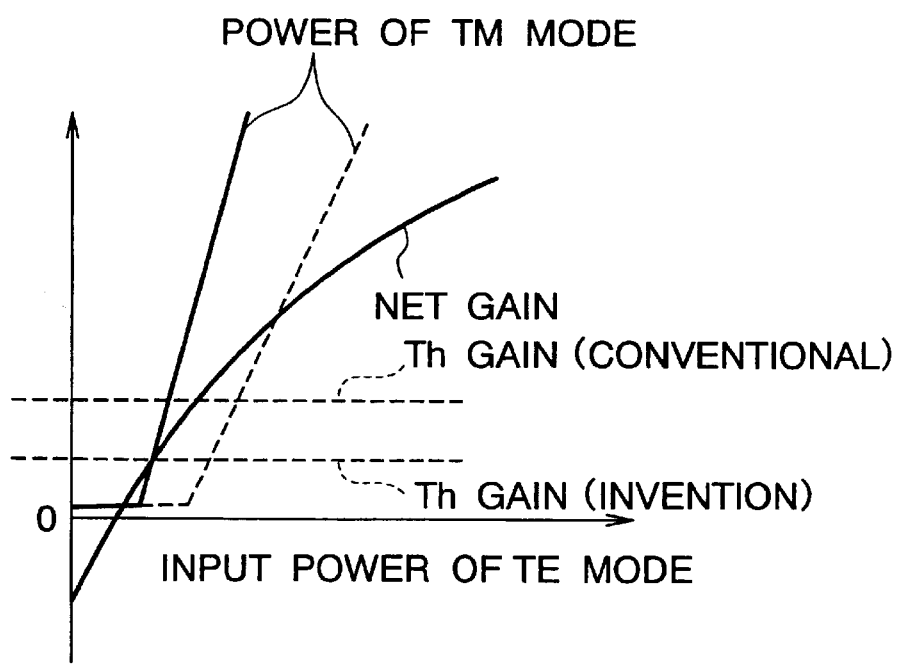
FIG. 2B is a graph showing dependency of the net gain and the outgoing TM mode light power in the mode converter of FIG. 2A on incident TE mode light power.

Referring to FIG. 2B, there is shown a comparison between the conventional TE/TM converter and the TE/TM converter according to the present embodiment in the dependency of the net gain and the outgoing TM mode light power on the incident TE mode light power. As understood from FIG. 2B, the TE/TM mode converter of the present invention has a lower lasing threshold for the TM mode light, and accordingly, it is possible to obtain TM mode light at a lower incident TE light power compared to the conventional TE/TM mode converter.

Figure 3A:
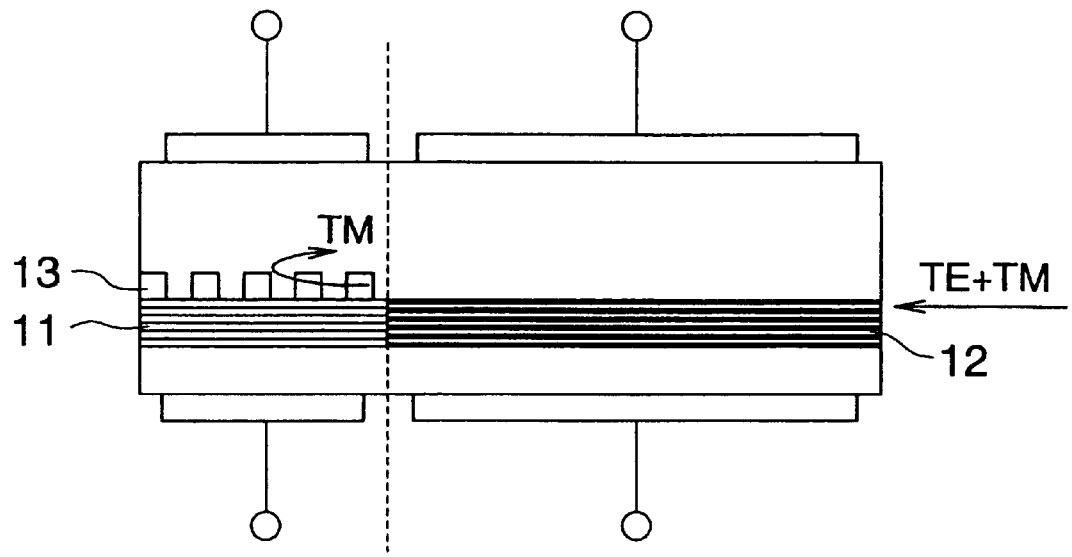
FIG. 3A is a schematic sectional view of the semiconductor TE/TM mode converter of FIG. 2A for showing the behavior of the reflected return light.
Figure 3B:
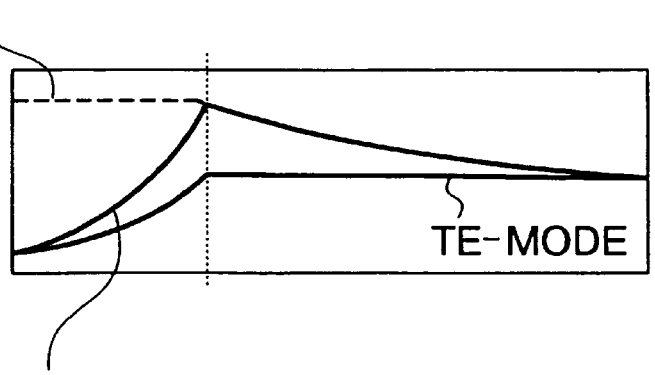
FIG. 3B is a graph of electric field distribution of the mode converter of FIG. 3A for showing the advantage of the present invention.

Referring to FIG. 3A, the semiconductor TE/TM mode converter of FIG. 2A receives reflected return light including a TE mode component and a TM mode component. The TE mode component is absorbed by the first region 11 acting as a saturable absorption layer, whereas the TM mode component is reflected by the diffraction grating 13 so that the return light does not reach the incident facet of the combined resonator. Referring to FIG. 3B, it is shown that the electric field distribution of the TE mode light in the first region 11 is significantly reduced (or improved) compared to the conventional converter due to the reflection of the TM mode component by the diffraction grating.

Figure 4:
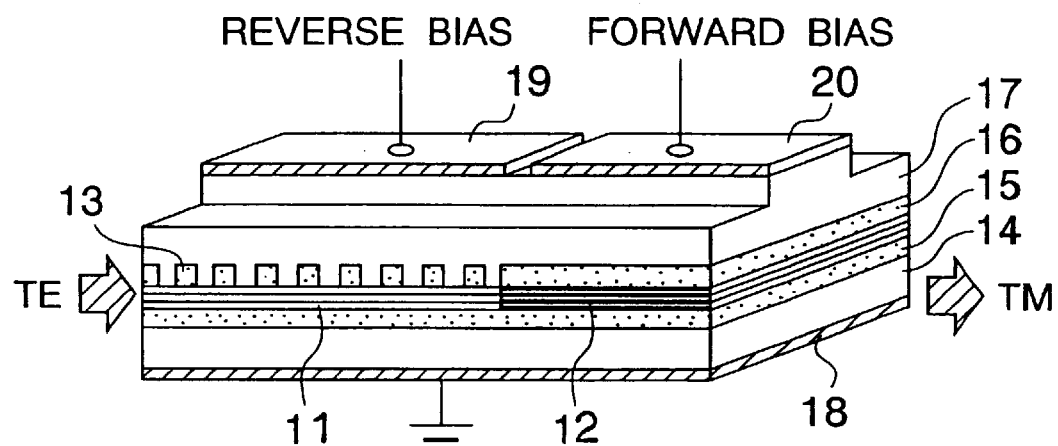
FIG. 4 through 7 are perspective views of TE/TM mode converters according to first through fourth embodiment of the present invention.

Semiconductor TE/TM mode converters were fabricated according to a first through fourth embodiment of the present invention. FIGS. 4 to 7 show the structure thus fabricated. The TE/TM mode converter of the first embodiment shown in FIG. 4 is fabricated as follows.

A GaInAsP quaternary cladding layer 15 was grown on an InP substrate 14, followed by selective growth to form a compressive-strained MQW in a first region 11, and by another selective growth to form a tensile-strained MQW in a second region 12. Another GaInAsP quaternary cladding layer 16 was then grown to bury the MQW structures 11 and 12, followed by electron beam exposure of the cladding layer 16 on the first region 11 to form a diffraction grating 13 having a desired pitch, that is 2430 Å for an incident wavelength of 1.5 $\mu$m or 2020 Å for an incident wavelength of 1.3 $\mu$m. An InP layer 17 is then grown thereon, followed by selective etching thereof to form a ridge waveguide structure having a 2 $\mu$m width by using a known photolithographic and etching technique. A common electrode 18 is then formed on the bottom surface of the InP substrate 14, and separate electrodes 19 and 20 are formed on the top of the ridge waveguide structure above the first region 11 and the second region 12, respectively. Thus, the TE/TM mode converter of FIG. 4 was obtained.

A reverse bias voltage was applied to the compressive-strained first region 11 across the electrodes 18 and 19 whereas current was injected to the tensile-strained second region 12 while applying a forward bias voltage thereto across the electrodes 18 and 20, in the TE/TM converter of FIG. 4. TE mode light was then incident to the incident facet of the compressive-strained first region 11 for conversion of the TE mode light to the TM mode light. In the present embodiment, the diffraction grating 13 selectively reflects the TM mode light selectively from the TE mode light to thereby lower the lasing threshold of the TM mode light and raise the conversion efficiency. The mode converter of FIG. 4 has a function for absorbing or reflecting polarized light, which prevents the reflected return light to the incident facet of the resonator.

Figure 5:
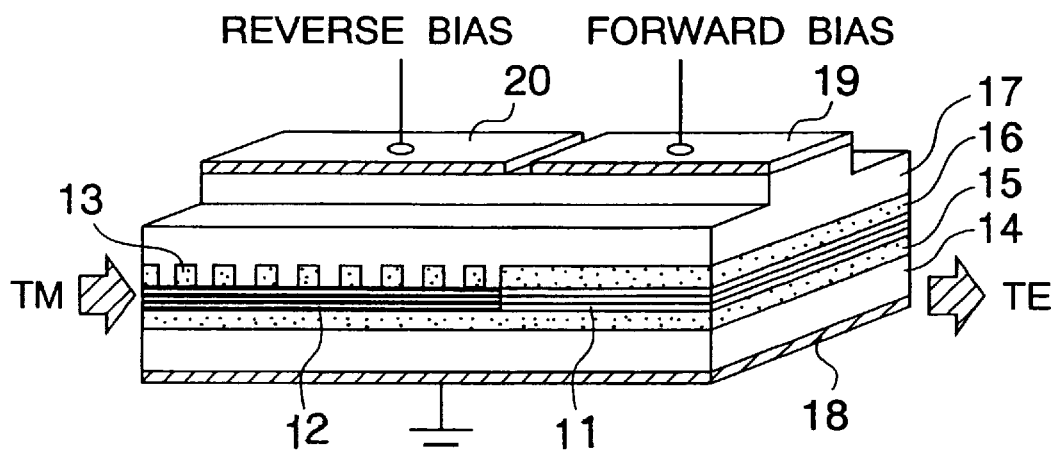

The TE/TM mode converter of FIG. 5 was fabricated similarly to the mode converter of FIG. 4 except that the diffraction grating 13 having a selective reflective function was formed on the tensile-strained MQW region 12 in FIG. 5. The compressive-strained MQW region 11 was forward-biased whereas the tensile-strained MQW region 12 was reverse-biased. Incident TM mode light from the facet of the second region 12 is converted to TE mode light outgoing from the facet of the first region 11 with a satisfactory conversion efficient.

Figure 6:
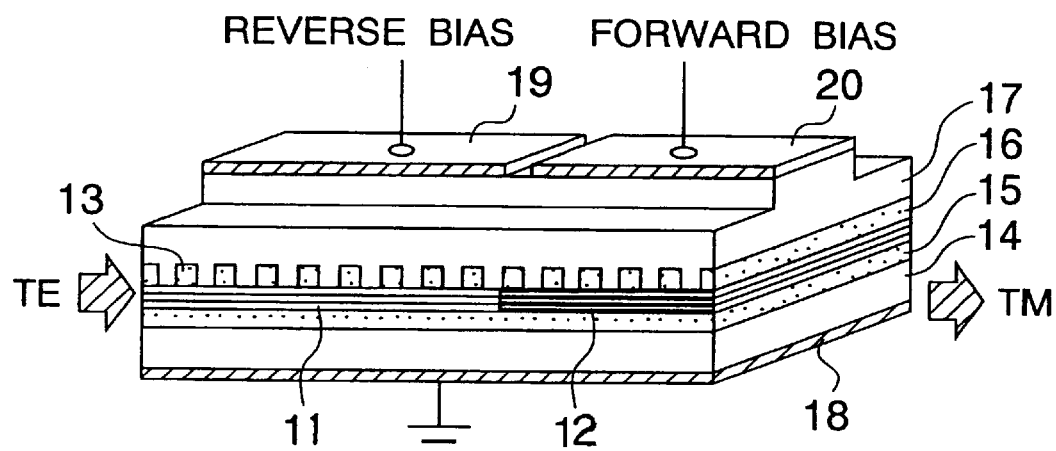
Figure 7:
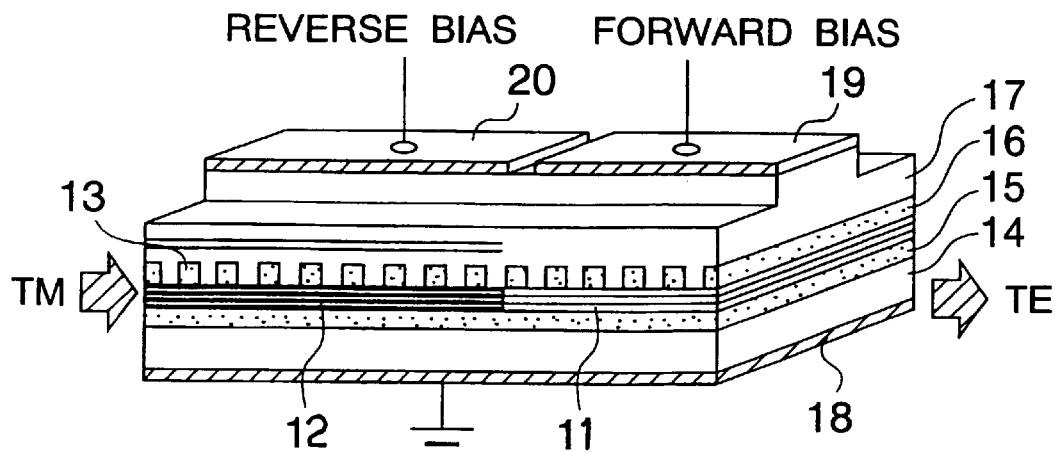

The TE/TM mode converters of FIGS. 6 and 7 were fabricated similarly to the mode converters of FIGS. 4 and 5, respectively, except that diffraction grating 13 is formed both on the first and the second regions in FIGS. 6 and 7. In FIG. 6, TE mode light incident on the facet of the compressive-strained MQW region 11 which is reverse-biased is converted to TM mode light outgoing from the facet of the tensile-strained MQW region 12 which is forward-biased. In FIG. 7, TM mode light incident on the facet of the tensile-strained MQW region 12 which is reverse biased is converted to TE mode light outgoing from the facet of the compressive-strained MQW region 11 which is forward-biased. In both the mode converters, satisfactory conversion efficiency could be obtained.

The diffraction grating 13 formed on the second region 12 having an amplifying function due to the forward bias thereof provides an outgoing light having a single mode wavelength, which is attributable to a principle similar to the principle of the distributed-feedback laser. In addition, since a high reflective coating film is not necessary on the outgoing facet, it is possible to integrate another optical element with the mode converter at the outgoing facet thereof.

As described above, the diffraction grating formed in the semiconductor TE/TM converter according to the embodiments of the present invention provides selective reflectance against the TM mode light from the TE mode light and prevents the return light from reaching the incident facet of the resonator, thereby enabling higher conversion efficiency and improvement in the characteristics of the mode converter.

Since the above embodiments are described only for examples, the present invention is not limited to the above embodiments and various modifications or alterations can be easily made therefrom by those skilled in the art without departing from the scope of the present invention. For example, the diffraction grating may selectively reflect TE mode light from TM mode light.

What is claimed is:

1. A polarization mode converter comprising a semiconductor optical waveguide layer including a first region and a second region, and a diffraction grating formed on said first region and/or said second region, said diffraction grating on one of said first and second regions selectively reflecting one of the TE and TM mode light, said first region having a compressive-strained multiple quantum well (MQW) structure, and said second region having a tensile-strained MQW structure.

2. A polarization mode converter as defined in claim 1, wherein said diffraction grating has a pitch effecting higher reflectance against one of TE mode light and TM mode light and lower reflectance against the other of TE mode light and TM mode light.

3. A polarization mode converter as defined in claim 1, wherein said first region and said second region have respective separate electrodes, whereby any of said first region and said second region functions as an amplifying region or an absorption region depending on a bias applied across said electrodes.

4. A polarization mode converter as defined in claim 1, wherein said diffraction grating is disposed on said first region, said diffraction grating has higher reflectance against TE mode light and lower reflectance against TM mode light, and said first region and said second region are forward-biased and reverse-biased, respectively, to convert TE mode light to TM mode light.

5. A polarization mode converter as defined in claim 1, wherein said diffraction grating is disposed on said second region, said diffraction grating has higher reflectance against TE mode light and lower reflectance against TM mode light, and said first region and said second region are forward-biased and reverse-biased, respectively, to convert TM mode light to TE mode light.

6. The polarization mode converter as defined in claim 1, wherein said diffraction grating in the first region provides mode light selectively.

* * * * *